United States Patent [19]

Geile et al.

[11] Patent Number: 4,879,527

[45] Date of Patent: Nov. 7, 1989

[54] PHASE LOCK LOOP AND IMPROVED PHASE DETECTOR THEREFOR

[75] Inventors: Michael Geile, Loveland; Mark Dapper, Cincinnati; Terrance Hill, Fairfield, all of Ohio

[73] Assignee: Cincinnati Electronics Corporation, Cincinnati, Ohio

[21] Appl. No.: 301,527

[22] Filed: Jan. 23, 1989

[51] Int. Cl.[4] .......................... H03L 7/08; H03K 5/26
[52] U.S. Cl. ..................................... 331/1 A; 331/12; 307/511; 307/528; 328/133
[58] Field of Search ...................... 331/1 A, 11, 12, 25; 328/133, 134, 155; 307/511, 525, 526, 527, 528

[56] References Cited

U.S. PATENT DOCUMENTS

| | | |
|---|---|---|
| 2,991,462 | 7/1961 | Hose . |
| 3,015,064 | 12/1961 | Husted et al. . |
| 3,016,475 | 1/1962 | Kirsten . |
| 3,548,321 | 12/1970 | Duquesne ............................. 328/133 |
| 3,956,623 | 5/1976 | Clark et al. ........................... 235/186 |
| 3,971,996 | 7/1976 | Motley et al. ........................ 328/155 |
| 4,061,977 | 12/1977 | Motley et al. ........................ 325/323 |
| 4,070,618 | 1/1978 | Thomas ................................ 324/78 |
| 4,178,631 | 12/1979 | Nelson, Jr. ........................... 364/484 |
| 4,264,866 | 4/1981 | Benes ................................ 307/526 X |
| 4,424,486 | 1/1984 | Denton et al. ....................... 324/225 |
| 4,584,652 | 4/1986 | Sturza et al. ........................ 364/484 |
| 4,675,614 | 6/1987 | Gehrke ............................... 328/133 |
| 4,680,721 | 7/1987 | Pluddemann ........................ 364/565 |
| 4,700,129 | 10/1987 | Voshizawa et al. .................. 324/83 |
| 4,752,749 | 6/1988 | Moger .............................. 331/25 X |

Primary Examiner—Eugene R. LaRoche
Assistant Examiner—Robert J. Pascal
Attorney, Agent, or Firm—Lowe, Price, LeBlanc, Becker & Shur

[57] ABSTRACT

A voltage controlled oscillator of a phase lock loop responds to a phase error signal having a value commensurate with the phase difference between input and output signals of the loop, wherein the phase difference extends over more than a one cycle difference of the loop input and output signals. The phase error signal is derived by mixing the loop input and output signals to derive a pair of signals having amplitudes representing orthogonal components of the difference frequency of the loop input and output signals. In response to the signals representing the orthogonal components, signals are derived indicative of the whole number cycle difference of the input and output signals, fractional cycle difference of the input and output signals, and a combination of the amplitudes of the signals representing the whole number cycle difference and the fractional cycle difference of the input and output signals. The latter combination indicates the amplitude of the arc whose tangent is the ratio of the input and output signals even though the loop input and output frequencies differ.

31 Claims, 4 Drawing Sheets

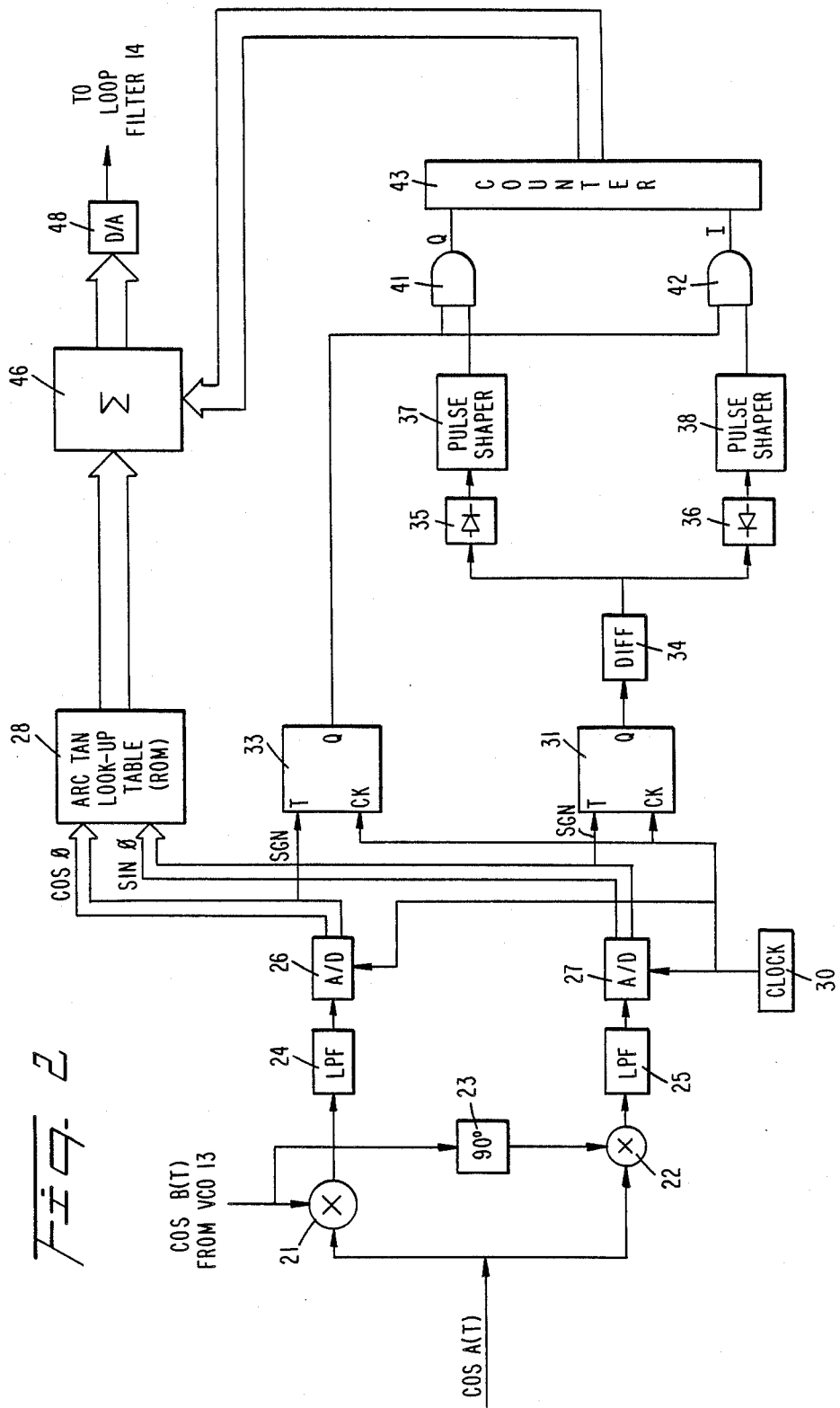

PHASE LOCK LOOP AND IMPROVED PHASE DETECTOR THEREFOR

FIELD OF INVENTION

The present invention relates generally to phase lock loops and more particular to a phase lock loop wherein an error signal for controlling a voltage controlled oscillator is commensurate with the phase difference between input and output signals of the loop even though there is more than a one cycle difference between the phase of the loop input and output signals with respect to an initial phase reference. In accordance with a further aspect of the invention, a phase detector for a pair of signals having different frequencies determines the whole number cycle difference with respect to a fixed reference phase for a pair of orthogonal components of the two signals, as well as the fractional cycle difference of the orthogonal components, and combines the amplitudes of the whole number and fractional differences.

BACKGROUND ART

One well-known type of phase lock loop combines a loop input signal with a variable frequency output signal of a voltage controlled oscillator. The loop input signal and voltage controlled oscillator output signal are applied to a mixer which derives a difference frequency that is applied to a low pass filter, frequently referred to as a loop filter. The loop filter drives a control input terminal of the voltage control oscillator with a signal having an AC component with a frequency equal to the frequency difference between the frequencies of the loop input signal and the voltage controlled oscillator output signal. When the loop input signal and oscillator signal frequencies are the same, the loop filter supplies the oscillator control input terminal with a DC component representing the phase difference, over a limited range, between the input signal and the voltage controlled oscillator output signal.

The mixer output signal is a phase error signal which is a sinusoidal function of the actual phase error between the loop input signal and the output signal of the voltage controlled oscillator. In consequence, when the typical prior art phase lock loop is acquiring a signal, the loop displays a non-monotonic characteristic, frequently causing the loop to slip many cycles before achieving phase lock between the loop input signal and the voltage controlled oscillator output signal.

The non-monotonic characteristic of the typical prior art phase lock loop occurs because of the sinusoidal nature of the phase error output signal of the mixer when the loop input signal differs in frequency from the voltage controlled oscillator output signal. The sinusoidal phase error signal results in an oscillatory acquisition behavior of the typical prior art phase lock loop. If the loop is designed as a first order loop, as determined by the characteristics of the loop filter, there is a maximum frequency offset for which the loop can never achieve lock because the phase error signal can only be generated over a limited range. While a second order loop is capable, in principle, of achieving phase lock between the loop input signal and the voltage controlled oscillator output, implementation considerations limit the practical pull-in range to something on the order of the loop bandwidth or slightly greater for loop input signals having high signal-to-noise ratios.

While the acquisition range of a phase lock loop can be increased by increasing the loop filter bandwidth, this has the deleterious effect of increasing the signal-to-noise ratio requirements for a detectable loop input signal. Hence, one of the very purposes of a phase lock loop, i.e., to provide a very narrow bandwidth detector for signals having low signal-to-noise ratios, is obviated by increasing the loop bandwidth.

It is, accordingly, an object of the present invention to provide a new and improved phase lock loop capable of acquiring a signal over a relatively wide bandwidth, without reducing the loop detection characteristics.

Another object of the invention is to provide a new and improved phase lock loop having a monotonic output function relating the frequency difference between loop input and output signals.

An additional object of the invention is to provide a phase lock loop having a non-oscillatory acquisition behavior in response to input signals having a relatively wide spread of frequencies Still another object of the present invention is to provide a new and improved phase lock loop having a relatively wide frequency pull-in range and a relatively wide lock-in range.

THE INVENTION

In accordance with one aspect of the present invention, a phase lock loop derives a phase error signal having a monotonically varying amplitude commensurate with the phase difference between a loop input signal and a voltage controlled oscillator output signal even though the frequencies of the input signal and the oscillator output differ. Preferably, the phase error signal is linearly related to the phase difference between the loop input signal and the voltage controlled oscillator output signal. Hence, for example, in the preferred embodiment the phase error signal for a two cycle difference between the loop input signal and the voltage controlled oscillator output signal is eight times the error signal for a 90° phase difference between these two signals; this result occurs because a two cycle difference is commensurate with a 720° phase difference. Similarly, the phase error for a 1.5 cycle difference (equal to a 450° phase error) is 5 times that of a 90° phase error.

Because of the monotonic, preferably linear, relationship between the phase error of the loop input and the oscillator output, which controls the oscillator by way of a loop filter, the oscillatory acquisition behavior of typical prior art loops is eliminated. Because the phase error signal in the present invention is truly proportional to the actual phase error between the input signal and the voltage controlled oscillator output signal even though these signals have frequencies that differ, there is a dramatic improvement in acquisition behavior, including significantly increased pull-in range with no increase in loop bandwidth.

It is, accordingly, another object of the present invention to provide a method of and apparatus for deriving an indication of phase error between a pair of signals even though the signals differ in frequency from each other.

Still an additional object of the invention is to provide a method of and apparatus for deriving an error signal that is linearly related to the phase difference between a pair of signals, even though the phase of the signals differs from each other by more than one cycle.

In the preferred embodiment of the present invention the phase error indicating signal is derived by combining first and second signals whose phases are being compared to derive third and fourth signals representing the in-phase and quadrature-phase relationship between the first and second signals. The third and fourth signals, which are in quadrature phase relation with each other, are combined, for example in an arc tangent look-up table, and are applied to a phase range extender also responsive to the arc tangent signal derived by the look-up table. The phase range extender derives a signal having an amplitude that is a monotonic function of the phase difference of the first and second signals even though the first and second signals differ in frequency.

More particularly, a signal having a magnitude indicative of the phase difference between first and second signals having similar but not necessarily the same frequencies is derived by responding to the first and second signals to derive third and fourth signals having amplitudes respectively representing the amplitudes of orthogonal components of the difference frequency of the first and second signals. In response to the third and fourth signals there are derived fifth, sixth and seventh signals respectively having amplitudes indicative of (a) the difference in the number of cycles of the third and fourth signals, (b) the fractional cycle difference of the third and fourth signals, i.e., the modulo $2\pi$ phase angle difference of the third and fourth signals, and (c) a combination of the amplitudes of the fifth and sixth signals. The sixth signal is derived in response to the amplitude of the arc tangent of the ratio of the third signal to the fourth signal.

Preferably, the sixth signal is derived by a lookup table responsive to the amplitudes of the third and fourth signals to derive the sixth signal as an approximate function of the arc tangent of the ratio of the amplitudes of the third and fourth signals. The use of a look-up table responsive to the amplitudes of the third and fourth signals obviates problems associated with determining the amplitude of the ratio of the third and fourth signals when these signals differ from each other by about a quarter of a cycle, i.e., in the vicinity of 90°, and odd multiples thereof, i.e., $(2n-1)(\pi/2)$ radians.

In the preferred embodiment, the fifth signal is derived by determining cycle slippage between the third and fourth signals. Preferably, the fifth signal is derived by incrementing and decrementing a cycle slippage count in response to the amplitude of the third signal having a first predetermined polarity and the amplitude of the fourth signal changing polarity; the count is respectively incremented and decremented in response to the fourth signal changing polarity in first and second directions.

Preferably, the fifth, sixth and seventh signals are derived with amplitudes respectively linearly proportional to: the cycle difference of the third and fourth signals, the fractional cycle difference, i.e., modulo $2\pi$ phase difference, of the third and fourth signals, and the sum of the amplitudes of the fifth and sixth signals. Thereby, the seventh signal has an amplitude that is linearly proportional to the phase difference between the first and second signals even though they differ in frequency.

The above and still further objects, features and advantages of the present invention will become apparent upon consideration of the following detailed description of a specific embodiment thereof, especially when taken in conjunction with the accompanying drawings.

BRIEF DESCRIPTION OF THE DRAWINGS

FIG. 2 is a block diagram of a preferred embodiment of the extended range phase detector of the phase lock loop illustrated in FIG. 1;

DESCRIPTION OF THE DRAWING

Figure 1:
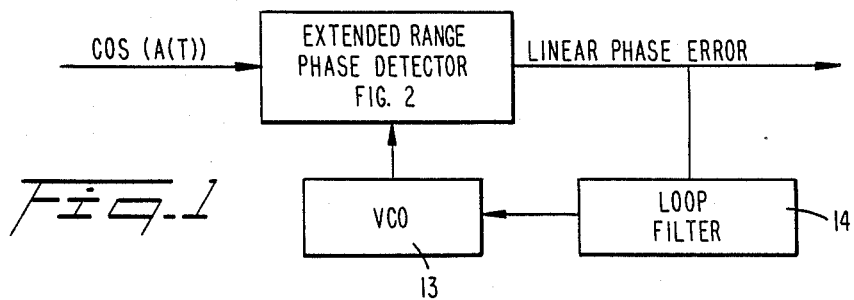
FIG. 1 is a block diagram of a phase lock loop in accordance with a preferred embodiment of the present invention.

Reference is now made to FIG. 1 of the drawing wherein an input signal to be acquired and detected is applied to phase lock loop 11 including extended range phase detector 12, having first and second inputs respectively responsive to the input signal and a variable frequency output signal of voltage controlled oscillator 13. Extended range phase detector 12 derives a bipolarity DC signal having an amplitude monotonically and linearly related to the phase difference of the signals applied to it, even though the signals applied to it may differ in frequency. For each cycle difference between the inputs of phase detector 12, the phase detector derives a signal having an amplitude which is directly proportional to 360°, i.e., $2\pi$ radians.

The term cycle in this specification is not to be confused with Hertz, i.e. cycles per second. To understand the concept of a cycle difference, consider the example of two signals having different frequencies and simultaneous zero crossings at time $t_1$ and wherein the next simultaneous zero crossings of the two signals occur at time $t_2$. In the interval between times $t_1$ and $t_2$ there is a one cycle difference between the two signals.

If the phase difference between the two input signals to phase detector 12 is 1°, causing the phase detector to derive a DC output signal having a magnitude of 1 millivolt, the phase detector derives an output signal having a magnitude of 360 millivolts for a one cycle difference of the inputs thereof. If the input signals to phase detector 12 differ from each other by the 1.25 cycles, the phase detector derives an output signal having a magnitude of 450 millivolts.

The DC output signal of phase detector 12 is therefore considered as a linear phase error relating the frequency and phase of the loop input signal, represented as cos A(T), and the voltage controlled oscillator output signal, represented by cos B(T), where $$A(T) = 2\pi f_1 t + \theta_1,$$

$$B(T) = 2\pi f_2 t + \theta_2,$$

and $f_1$ is not necessarily equal to $f_2$. The linear phase error output signal of detector 12 is applied to low pass loop filter 14 which removes any high frequency components that might subsist on the output of detector 12. The output of low pass filter 14 is applied to a control input of voltage controlled oscillator 13, to control the frequency and phase of the oscillator.

Voltage controlled oscillator 13 responds to the output signal of loop filter 14 so that the output phase of the oscillator varies as a function of the output voltage of the loop filter, hence as a function of the output signal of extended range phase detector 12. The output phase of oscillator 13 is controlled by the output voltage of loop filter 14 so that the phase of the oscillator output tracks the phase of the cos A(T) loop input signal to mixer 12. In response to the output voltage of loop filter 14 having a value associated with a one cycle difference between the output of voltage controlled oscillator 13 and the cos A(T) input to mixer 12, the phase of oscillator 13 is changed by 360°, i.e., one cycle. In this regard, the output frequency f of oscillator 13 relative to the oscillator center frequency $f_o$ is the rate of change of phase with respect to time, i.e., $(d\theta/dt) = 2\pi ft$, where $\theta$ is the phase of the output of voltage controlled oscillator 13, f is the frequency of the oscillator output, and t is time. Hence, $\delta f = \int \theta dt$, where $\delta f = f - f_o$, and $\theta$ is proportional to the output of loop filter 14.

Oscillator 13 is arranged so that as the amplitude of the output voltage of loop filter 14 increases positively, the phase and therefore frequency of the output of oscillator 13 decreases. Similarly, a negative output voltage of loop filter 14 causes the phase and frequency of the output of oscillator 13 to increase. The relationship between the output frequency of oscillator 13 and the output voltage of loop filter 14 subsists over a relatively large range of loop filter output voltage so that oscillator 13 is able to track and acquire loop input signals represented by cos A(T) over many cycles of the input signal.

A preferred embodiment of range extender 12 is illustrated in FIG. 2 as including mixers 21 and 22, driven in parallel by loop input signal cos A(T). Mixer 21 is directly responsive to the cos B(T) output signal of voltage controlled oscillator 13, while mixer 22 is responsive to a replica of the oscillator output, as shifted 90° by 90° phase shifter 23. Mixers 21 and 22 derive sum and difference frequency components which respectively are applied to low pass filters 24 and 25. The difference frequency components are passed by low pass filters 24 and 25 to the exclusion of the sum frequency components so that the low pass filters derive signals representing the in phase and quadrature phase components of the difference frequency between cos A(T) and cos B(T), so that the outputs of filters 24 and 25 are respectively represented as:

$$\cos \phi = \tfrac{1}{2} \cos (A(T) - B(T))$$
$$= \tfrac{1}{2} \cos (2\pi(f_1 - f_2)t - (\theta_1 - \theta_2)), \text{ and}$$

$$\sin \phi = -\tfrac{1}{2} \sin (A(T) - B(T))$$
$$= -\tfrac{1}{2} \sin (2\pi(f_1 - f_2)t - (\theta_1 - \theta_2))$$
$$= -\tfrac{1}{2} \sin (2\pi \Delta f t - \Delta \theta)$$

where
$\Delta \theta = \theta_1 - \theta_2$,
$\Delta f = f_1 - f_2$, and
t = time The output signals of filters 24 and 25 can be considered as having a DC component when the frequencies of A(T) and B(T) are the same and an AC component equal in frequency to the frequency difference between A(T) and B(T). The phase of the AC component is determined by the frequency difference between A(T) and B(T) and by phase errors of oscillator 13 tracking the loop input signal. The DC output components of low pass filters 24 and 25 represent the phase displacement of signals cos A(T) and cos B(T). The AC output components of low pass filters 24 and 25 have the same frequency, equal to the frequency difference of loop input signal cos A(T) and the cos B(T) output of oscillator 13.

To determine the phase difference between the two input signals applied to extended range detector 12, i.e., the phase difference between cos A(T) and cos B(T), over a several Hertz difference thereof, the output signals of filters 24 and 25 are applied to a digital processing network, illustrated in FIG. 2 as including hard wired components. It is to be understood, however, that the functions performed by the digital processing network can also be performed by a suitably programmed digital computer.

Basically, the digital processing network of FIG. 2 determines the fractional cycle difference between the in phase and quadrature phase components derived from low pass filters 24 and 25, i.e. the modulo $2\pi$ phase difference between the outputs of filters 24 and 25, and when a cycle transition occurs between cos A(T) and cos B(T). The process for determining the cycle transition is based on the observance of a phasor cycle rotation as determined by the sin $\phi$ and $-\cos \phi$ outputs of filters 24 and 25. An arbitrary phase boundary for a frequency transition between cos A(T) and cos B(T) is established as a point at which a cycle rotation in the sin $\phi$ and $-\cos \phi$ outputs of filters 24 and 25 is to be declared. A cycle rotation is associated with a one cycle slippage between cos A(T) and cos B(T). A cycle indication is derived by monitoring the phase boundary from sin $\phi$ and $-\cos \phi$ and making a determination of when and in which direction the phase boundary is crossed. When a phase boundary is crossed, a cycle counter is incremented or decremented. The decision as to whether the counter is incremented or decremented is a function of the direction of the phase boundary traversal. The cycle counter thus functions as a memory for the frequency error between cos A(T) and cos B(T).

The easiest method of detecting boundary crossings is to determine when the phasor indicated by the values of sin $\phi$ and $-\cos \phi$ crosses a horizontal (X) axis or vertical (Y) axis of the complex plane. For example, if the positive real axis of the complex plane is selected as a frequency transition point between cos A(T) and cos B(T) a frequency change is detected when (1) the sign, i.e. polarity, bit of a digital representation of the in-phase output signal of low pass filter 24 has a positive value and (2) there is a change in the sign bit of a digital representation of the quadrature phase output of low pass filter 25. The direction of the quadrature sign change determines whether the cycle counter is incremented or decremented.

To these ends, the output signals of low pass filters 24 and 25 are converted into digital signals by being respectively applied to digital-to-analog converters 26 and 27, responsive to clock source 30 to derive a multibit parallel output. At any time instant, the magnitude of the digital signals derived from converters 26 and 27 respectively represent sin $\phi$ and $-\cos \phi$, where $\phi$ = the phase angle between B(T) and $$A(T) = 2\pi f_1 t + \theta_1 - (2\pi f_2 t + \theta_2),$$
$$= 2\pi(f_1 t - f_2 t) + (\theta_2 - \theta_1) \text{ radians.}$$

If, for example, at a particular time interval $f_1 - f_2 = \Delta f = 1$ and cos B(T) and cos A(T) have simultaneous zero crossings, the values of cos $\phi$ and sin $\phi$ vary approximately sinusoidally for a duration of one second as cosine and sine functions. At the end of one second, there is a phase displacement of $$\frac{A(T) - B(T)}{f_1} = \frac{2\pi \Delta ft - \Delta \theta}{f_1}$$

between cos B(T) and cos A(T).

Since t=one second, $\Delta f=1$, and $\Delta \theta = 0$ (resulting from A(T) and B(T) having simultaneous zero crossings at t=0), the phase displacement at the end of one second is $2\pi/f_1$. With no corrective action and these assumed parameters, after $f_1$ seconds there is a $2\pi$ radian (equal to 360°) phase difference, i.e. one cycle difference, between cos B(T) and cos A(T). Each one cycle difference between cos B(T) and cos A(T) is sensed by sensing a polarity change in the $-\sin \phi$ output of converter 27 while the cos $\phi$ output of converter 26 is sensed as being positive.

A continuous indication of phase angle $\phi$ within integral cycle changes of cos A(T) and cos B(T), i.e. an indication of fractional cycle differences between cos A(T) and cos B(T), is determined by supplying the cos $\phi$ and $-\sin \phi$ output signals of converters 26 and 27 to look-up table 28. Look-up table 28 effectively responds to the cos $\phi$ and $-\sin \phi$ representing output signals of converters 26 and 27 to determine the arc tangent of the signal which is represented by the amplitudes of the output signals of the converters.

Look-up table 28 is basically a two input read-only memory for four quadrant values of the arc tangent function To address table 28, the cos $\phi$ and $-\sin \phi$ representing output signals of converters 26 and 27 include, in a preferred embodiment, a polarity or sign bit followed by three magnitude bits. Look-up table 28 responds to the polarity representing output bits of converter 26 and 27 to determine the quadrant for the value of $\phi$ and the magnitude bits determine the value of $\phi$ within each quadrant. Look-up table 28 is preprogrammed to derive a multibit signal representing the value of $\phi$ from zero radians to $2\pi$ radians, in terms of fractional increments of a one cycle difference between cos A(T) and cos B(T). To avoid inaccuracies associated with dividing a finite number by a very small number, as occurs when $\phi$ is approximately 90° and 270°, look-up table 28 responds directly to the values of $-\sin \phi$ and cos $\phi$ and does not perform any division function.

Figure 3:
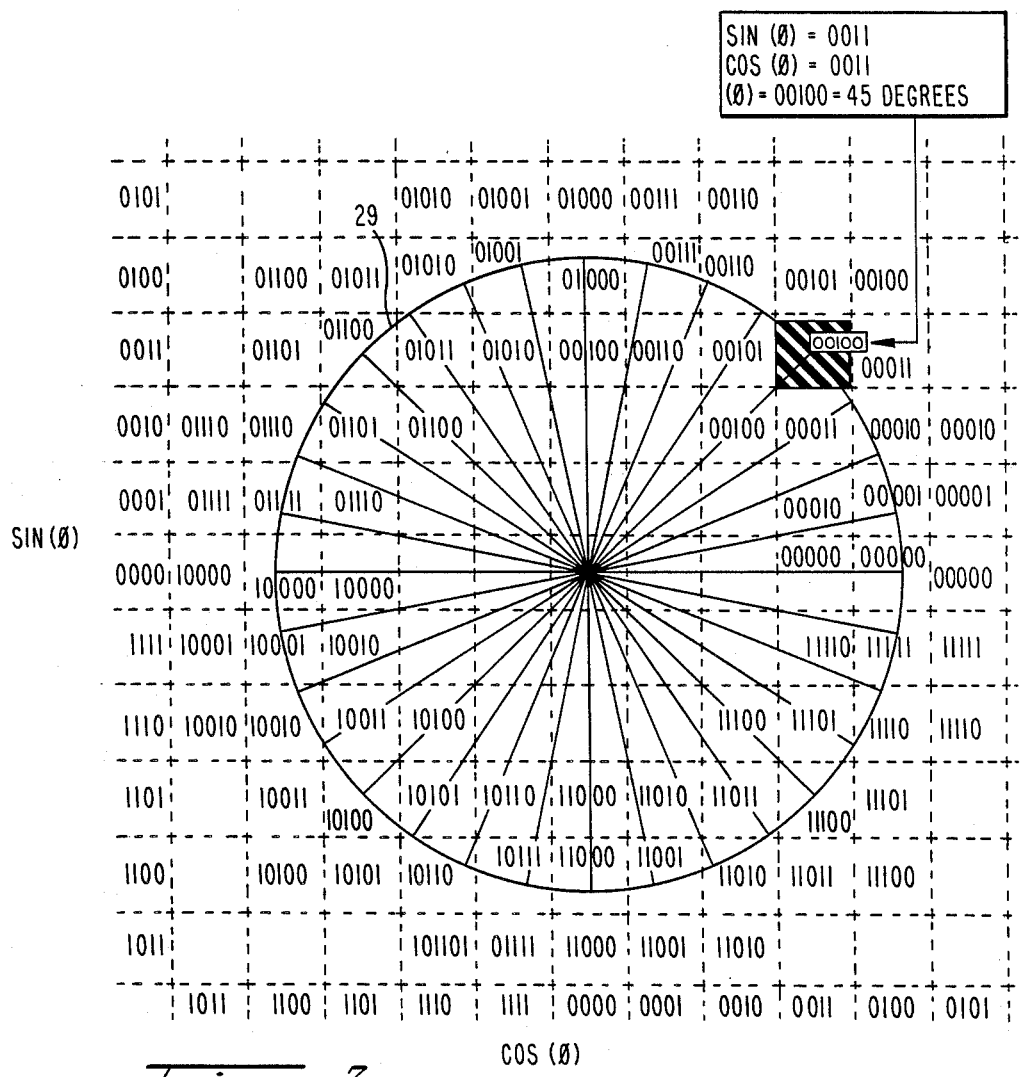
FIG. 3 and 4 are diagrams useful in describing the operation of a look-up table illustrated in FIG. 2.

In the preferred embodiment, the values of $\phi$ are stored in look-up table 28 in the manner indicated by FIG. 3, wherein cos $\phi$ is plotted along the horizontal or X axis while the value of sin $\phi$ is plotted along the vertical or Y axis. For a cos A(T) signal having zero noise, the values of lie along the perimeter of circle 29 and are commensurate with the centers of the 32 bins or squares in which the perimeter of circle 29 lies. For a practical cos A(T) signal having noise, the values of cos $\phi$ and sin $\phi$ did not necessarily lie in the 32 bins along the perimeter of circle 29, but may be in any of the 121 bins formed by the combinations of cos $\phi$ and sin $\phi$. The arc tangent $\phi$ value associated with each of the 121 bins is addressed in response to the cos $\phi$ and $-\sin \phi$ output signals of converters 26 and 27 as applied to the input of look-up table 28. In response to the $-\sin \phi$ and cos $\phi$ input signals fed to look-up table 28, the look-up table derives an output signal representing the angle $\phi$, in radians, over a $2\pi$ radian interval, i.e., over 360°, i.e. the output of table 28 represents the fraction of one cycle between the phases of cos A(T) and cos B(T).

Figure 4:
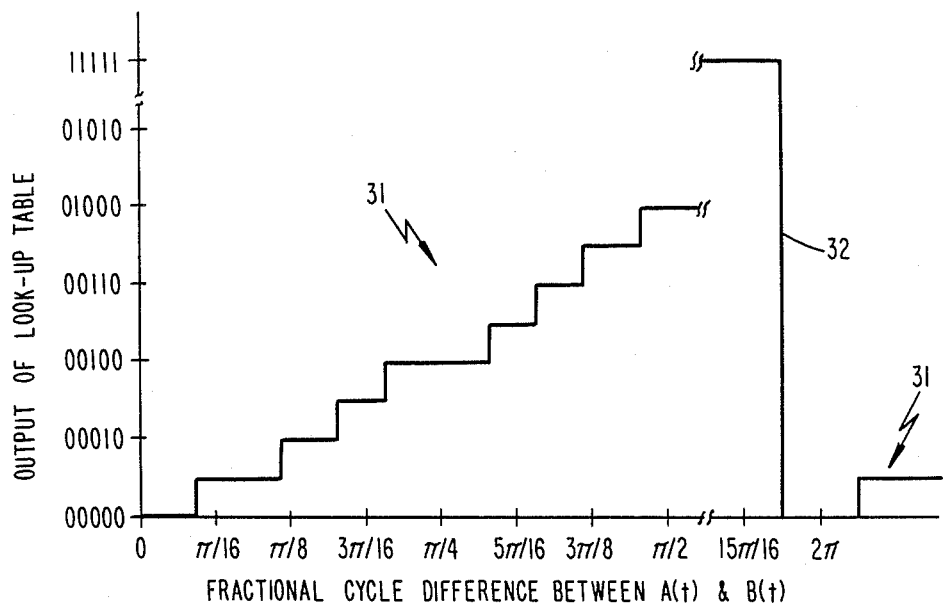

The digital output signal of look-up table 28 representing the value of $\phi$ is thus a modulo $2\pi$ phase function, as illustrated in FIG. 4 for the 32 bins around the perimeter of circle 29. In FIG. 4 the value of the amplitude of the output signal of look-up table 38 is plotted over a slightly more than a one-cycle difference between the signals cos A(T) and cos B(T). For each cycle difference between cos A(T) and cos B(T), the output of look-up table 28 includes 32 steps, as represented by stair step waveforms 31 having digital values from 00000 to 11111. Each of waveforms 31 covers a gamut of phases between slightly less than radians and slightly less than $2\pi$ radians. In response to a one cycle change between cos A(T) and cos B(T), e.g., between $15/16\pi$ and $2\pi$ radians, there is a sudden transition in the output of look-up table 28 from a value of 11111 to a value of 00000, respectively representing approximately $2\pi$ radians and approximately 0 radians, as represented by vertical line 32. The output of read-only memory 28 is a digital signal representing the phase difference between cos A(T) and cos B(T) within a single cycle of cos A(T) and cos B(T) even though cos A(T) and cos B(T) have different frequencies.

If signals cos A(T) and cos B(T) are noiseless, the digital output signal of memory 28 includes five bits varying in value from 00000 for the bin cos $\phi=$ 0000, sin $\phi=0100$ to 11111 for the bin cos $\phi=1111$, sin $\phi=0100$. The values of the five bits proceed in order as the value of $\phi$ steps from bin cos $\phi=0000$, sin $\phi=0100$ in a counter clock-wise direction to bin cos 1111, sin 0100. Analog to digital converters 26 and 27 are designed to respond to the outputs of filters 24 and 25 so that the converters derive 00000 output signals in response to the filters deriving signals having values of $(0 \pm \epsilon)$ volts. As the output voltages of filters 26 and 27 increase monotonically from $+\epsilon$ to $+3\epsilon$, from $+3\epsilon$ to $+5\epsilon$, from $+5\epsilon$ to $+7\epsilon$, from $+7\epsilon$ to $+9\epsilon$ and from $+9\epsilon$ to a maximum of $+11\epsilon$, the output signals of analog to digital converters 26 and 27 have values respectively of 0001, 0010, 0011, 00100 and 0101. As the output voltages of filters 24 and 25 increase in a negative manner from $-1\epsilon$ to $-3\epsilon$, from $-3\epsilon$ to $-5\epsilon$, from $-5\epsilon$ to $-7\epsilon$, from $-7\epsilon$ to $-9\epsilon$ and from $-9\epsilon$ to a maximum of $-11\epsilon$, the output signals of converter 26 and 27 respectively have values of 1111, 1110, 1101, 1100, and 1011. From the foregoing, all positive output signals of filters 24 and 25 cause the most significant bit outputs of converters 26 and 27 to have binary zero values, while negative output voltages of the filters result in the most significant bit output .f the converters to be binary ones. The positive value output signals of converters 26 and 27 progress in the normal binary manner, such that the three least significant bits of the outputs of the converters represent the decimal numbers 1-5 in sequence. The three least significant bits for the negative representing output signals of converters 26 and 27 for the five negative possibilities of the outputs of the converters have numeric values sequentially representing 7 through 3 as the input signals to the converters progress in value from $-\epsilon$ to $-11\epsilon$.

Memory or table lookup 28 responds to the output signals of converters 26 and 27 to provide the values indicated in FIGS. 3 and 4, as well as indicated by Table I.

TABLE I

| φ (radians) | cos φ output of converter 27 | sin φ output of converter 26 | φ output of memory 28 |
|---|---|---|---|
| 0 | 0100 | 0000 | 00000 |
| $\frac{\pi}{16}$ | 0100 | 0001 | 00001 |
| $\frac{\pi}{8}$ | 0100 | 0010 | 00010 |
| $\frac{3\pi}{16}$ | 0011 | 0010 | 00011 |
| $\frac{\pi}{4}$ | 0011 | 0011 | 00100 |
| $\frac{5\pi}{16}$ | 0010 | 0011 | 00101 |
| $\frac{3\pi}{8}$ | 0010 | 0100 | 00110 |
| $\frac{7\pi}{16}$ | 0001 | 0100 | 00111 |
| $\frac{\pi}{2}$ | 0000 | 0100 | 01000 |
| $\frac{9\pi}{16}$ | 1111 | 0100 | 01001 |
| $\frac{5\pi}{8}$ | 1110 | 0100 | 01010 |
| $\frac{11\pi}{16}$ | 1110 | 0100 | 01011 |
| $\frac{3\pi}{4}$ | 1101 | 0011 | 01100 |
| $\frac{13\pi}{16}$ | 1101 | 0010 | 01101 |
| $\frac{7\pi}{8}$ | 1100 | 0010 | 01110 |
| $\frac{15\pi}{16}$ | 1100 | 0001 | 01111 |
| π | 1100 | 0000 | 10000 |
| $\frac{17\pi}{16}$ | 1100 | 1111 | 10001 |
| $\frac{9\pi}{8}$ | 1100 | 1110 | 10010 |
| $\frac{19\pi}{16}$ | 1101 | 1110 | 10011 |
| $\frac{5\pi}{4}$ | 1101 | 1101 | 10100 |
| $\frac{21\pi}{16}$ | 1110 | 1101 | 10101 |
| $\frac{11\pi}{8}$ | 1110 | 1100 | 10110 |
| $\frac{23\pi}{16}$ | 1111 | 1100 | 10111 |
| $\frac{3\pi}{2}$ | 0000 | 1100 | 11000 |
| $\frac{25\pi}{16}$ | 0001 | 1100 | 11001 |
| $\frac{13\pi}{8}$ | 0010 | 1100 | 11010 |
| $\frac{27\pi}{16}$ | 0010 | 1101 | 11011 |
| $\frac{7\pi}{4}$ | 0011 | 1101 | 11100 |
| $\frac{29\pi}{16}$ | 0011 | 1110 | 11101 |
| $\frac{15\pi}{8}$ | 0100 | 1110 | 11110 |
| $\frac{31\pi}{32}$ | 0100 | 1111 | 11111 |

As indicated supra, the values of the output signal of memory 28 progress in order, beginning with a value of 00000 for the angle φ=0±Δ, where Δ is the angle from the center of the circle to the intersection of circumference 29 where the transition in the output of converter 26 is from 0000 to 0001; at φ=0, Δ=(π/36), the cos φ output signal of converter 26=0100, and the sin φ output of converter 2 =0100. As the value of φ increases, the output of memory 28 increases correspondingly, so that, for example, when φ=π/02, the output of memory 28 is a digital signal having a value of 01000, in response to the sin φ and cos φ outputs of converters 26 and 27 being 0100 and 0000, respectively. At the intermediate point between φ=0 and φ=π/2, i.e., at φ=π/4, the output of memory 28 is 00100 in response to the cos φ and sin φ outputs of converters 26 and 27 both being equal to 0011. From the foregoing, and with the aid of FIGS. 3 and 5, as well as Table I, the manner in which memory 28 responds to relatively noiseless input signals, cos A(T) causes the outputs of converters 26 and 27 to produce signals that lie on circumference 29 of the circle of the FIG. 3 is evident.

However, usually the received signal is not noiseless. Received signals containing noise frequently cause the outputs of converters 26 and 27 to have values that produce combinations of sin φ, cos φ values in FIG. 3 which do not lie on circumference 29 of the circle or in bins where the circumference of the circle touch. For example, the outputs of converters 26 and 27 may result in cos φ=0000, sin φ=0011. In such a situation, memory 28 is programmed to derive a five bit output signal having a value commensurate with the angle value that is closest to the center of the bin assigned to the particular combination of sin φ, cos φ. For example, in the above example wherein cos φ=0000, sin φ=0011, memory 28 is programmed to derive a 0000 output signal, representing the angle φ=φ/2. For the bin of FIG. 3 wherein cos φ=0010 and sin φ=0001, memory 28 is programmed to derive a 00010 output signal. The value of 00010 is selected over the values 00001 and 00011 because the φ=00010 line from the center of the circle to the circumference 29 is D closer to the center of the bin for cos φ=0011, sin φ=0001 than are the other two lines The same criterion is used to determine the φ output of memory 28 regardless of whether the bin for the values of cos φ, sin φ is inside or outside the circumference of the circle illustrated in FIG. 3.

If the combination of the sin φ, cos φ input signals to memory 28 indicates an intolerably high noise level for cos A(T), the output of the memory does not deviate from its previous value and the memory does not respond to such a combination. An intolerably high noise level is indicated for the bins in FIG. 3 wherein the values of cos φ, sin φ are excessively spaced from the circumference 29 of the circle. Excessive spacing is usually defined as a bin that does not form the circumference of two approximate circles that are inscribed by or which surround the circle having circumference 29. Sixteen bins are in the approximate circle inscribed by circumference 29; 28 bins are in the approximate circle surrounding circumference 29. The sin φ, cos φ combinations and the outputs of memory 28 for the inscribed and surrounding approximate circles are given in Tables II and III, respectively.

TABLE II

| cos φ | sin φ | φ output |
|-------|-------|----------|
| 0011  | 0000  | 00000    |
| 0011  | 0001  | 00010    |
| 0011  | 1111  | 11110    |
| 0010  | 0010  | 00100    |
| 0010  | 1110  | 11100    |
| 0001  | 0011  | 00110    |
| 0001  | 1101  | 11010    |
| 0000  | 0011  | 01000    |
| 1111  | 0011  | 01010    |
| 1110  | 0010  | 01100    |
| 1110  | 1110  | 10100    |
| 1101  | 0001  | 01110    |
| 1101  | 0000  | 10000    |
| 1101  | 1111  | 10010    |
| 1111  | 1101  | 10110    |
| 0000  | 1101  | 11000    |

TABLE III

| cos φ | sin φ | φ output |
|-------|-------|----------|
| 0101  | 0010  | 00010    |
| 0101  | 0001  | 00001    |
| 0101  | 0000  | 00000    |
| 0101  | 1111  | 11111    |
| 0101  | 1110  | 11110    |
| 0100  | 0011  | 00011    |
| 0100  | 1101  | 11101    |
| 0011  | 0100  | 00101    |
| 0011  | 1100  | 11011    |
| 0010  | 0100  | 00110    |
| 0010  | 1011  | 11010    |
| 0001  | 0101  | 00111    |
| 0001  | 1011  | 11001    |
| 0000  | 0101  | 01000    |
| 0000  | 1011  | 11000    |
| 1111  | 0101  | 01001    |
| 1111  | 1011  | 01111    |
| 1110  | 0101  | 01010    |
| 1110  | 1011  | 10110    |
| 1101  | 0100  | 01011    |
| 1101  | 1100  | 10101    |
| 1100  | 0011  | 01101    |
| 1100  | 1101  | 10011    |
| 1011  | 0010  | 01110    |
| 1011  | 0001  | 01111    |
| 1011  | 0000  | 10000    |
| 1011  | 1111  | 10001    |
| 1011  | 1110  | 10010    |

If the sin φ, cos φ values have a combination that does not appear in any of Tables I, II or III, memory 28 is unresponsive to the combination, so that there is no change in an output signal of an output register of memory 28. Thus, e.g., the values sin φ=0101, cos φ=0101 and sin φ=0100, cos φ=0100 do not cause any change in the output of memory 28.

The fractional cycle phase representing five bit output signal of look-up table 28 is combined with a multi-bit signal indicating the integer cycle difference between cos A(T) and cos B(T). The signal indicating the total phase difference between cos A(T) and cos B(T) can be thought of as including seven or more bits; the five least significant bits have assigned values of zero which are added to the five bit output of memory 28. As the cycle difference between cos A(T) and cos B(T) changes the values of the higher order bits change appropriately. At least two higher order bits are required to track polarity changes in the number of cycle differences between cos A(T) and cos B(T) and at least one cycle change in each direction. In actuality many higher order bits are used to track many cycle changes between cos A(T) and cos B(T). The signal representing the cycle difference is derived by accumulating signals indicating when the phase difference between cos A(T) and cos B(T) has progressed through 2π radians.

To these ends, a determination is made of the occurrence of a zero axis crossing of sin φ while cos φ is positive. To determine when cos φ is positive, the polarity or sign indicating output bit of analog to digital converter 26 is applied to a T or toggle input of T or toggle flip flop 33 having a clock input responsive to clock source 30. In response to the sign bit of the output of converter 27 having zero and one values, flip flop 33 derives binary zero and one levels at the Q output thereof which replicates the value of the most recent polarity output bit of converter 26. Hence, flip flop 33 derives a binary one output signal in response to the polarity bit output of converter 26 having a binary one value to indicate a positive polarity of cos φ; conversely, detector 33 derives a binary zero value in response to the output of converter 26 having a binary zero polarity bit representing a negative value of cos φ.

To detect transitions in the polarity of the sin φ representing output signal of converter 27, the polarity indicating bit derived by converter 27 and the output of clock 30 are applied to toggle flip flop 31, which functions as described for flip flop 33 to replicate the state of the sign bit of the output of converter 27. Transitions in the state of the sign bit output of converter 27 are detected by supplying the Q output of flip flop 31 to differentiator 34. Differentiator 34 derives positive pulses in response to the polarity indicating output bit of converter 27 going from a binary zero level to a binary one level (indicative of a transition from a negative value of sin φ to a positive value of sin φ). Differentiator 34 derives negative pulses in response to the sign or polarity output bit of converter 27 going from a binary one to a binary zero level (indicative of sin φ going from a positive to a negative value). The positive and negative pulses derived by differentiator 34 are applied in parallel to positive pulse detector 35 and negative pulse detector 36 which respectively drive pulse shapers 37 and 38. Thereby, pulse shapers 37 and 38 respectively derive binary one levels in response to sin φ changing polarity from minus to plus and sin φ changing polarity from plus to minus.

The output signals of pulse shapers 37 and 38 are respectively applied to AND gates 41 and 42, both responsive to the output of amplitude detector 33. AND gate 41 derives a binary one output pulse in response to cos B(T) increasing by one cycle relative to cos A(T). AND gate 42 derives a binary one output pulse in response to cos A(T) increasing by one cycle relative to cos B(T).

The output signals of AND gates 41 and 42 are applied to increment and decrement input terminals of reversible counter 43, having multiple output stages commensurate with the maximum cycle difference over which cos A(T) is to be tracked. For example, if cos A(T) is to be tracked over a cycle difference of 1024, counter 43 includes ten stages to provide $2^{10}$ values.

During acquisition of signal cos A(T), when the frequency of oscillator 13 is in a transient state, there is considerable cycle slippage between cos A(T) and cos B(T), resulting in relatively high frequency pulses being derived by one of AND gates 41 or 42. However, once the phase lock loop has achieved frequency lock between cos A(T) and cos B(T) pulses are applied by AND gates 41 and 42 to the increment and decrement inputs of bi-directional counter 43 at a relatively low rate.

At any time interval, the count stored in counter 43 represents the cycle difference between cos A(T) and cos B(T). If there is no cycle difference between cos A(T) and cos B(T), the count in counter 43 is at a median position, to which the counter is reset at the beginning of cos A(T) signal acquisition. (Memory 28 is also initially set at $\phi = 00000$.) Flip-flop stages of cycle counter 43 are arranged so that for each pulse applied to counter 43, the counter digital output signal changes by a value of one. For example, if cos A(T) is three cycles ahead of cos B(T), counter 43 derives an output signal having a zero most significant bit (to indicate cos A(T) is ahead of cos B(T)) and two least significant bits with values of 11 (to indicate the three cycle difference).

Figure 5:
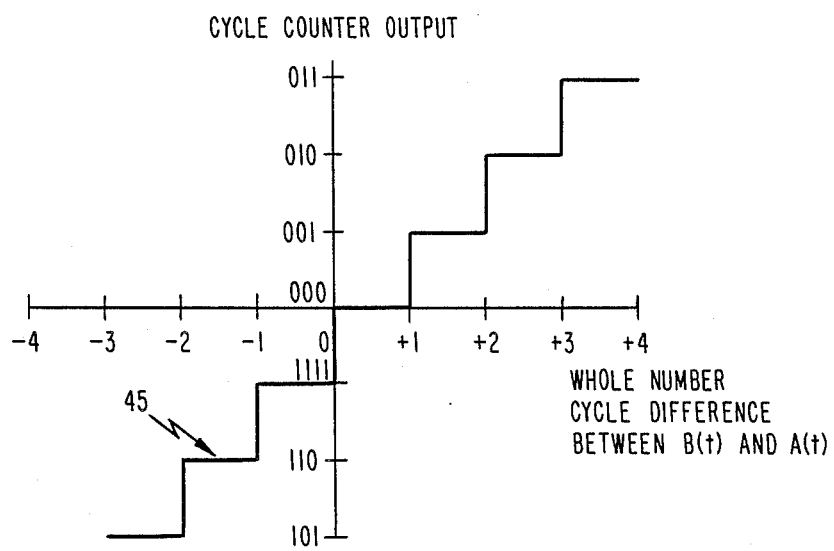
FIG. 5 is a diagram useful in describing the operation of a counter illustrated in FIG. 2.

The amplitude of the output signal of counter 43 is represented in FIG. 5 by stair-step waveform 45. In FIG. 5, the output of read-only memory 45 is plotted as a function of $\phi$ over a seven cycle difference between cos B(T) and cos A(T). Transitions in the step output occur only in response to counter 43 being incremented or decremented. Each time counter 43 is incremented or decremented there is a change of one in the magnitude of the binary output of the counter. Each change occurs simultaneously with the changes indicated by lines 32 in the output of read-only memory 28, as indicated by FIG. 4.

Figure 6:
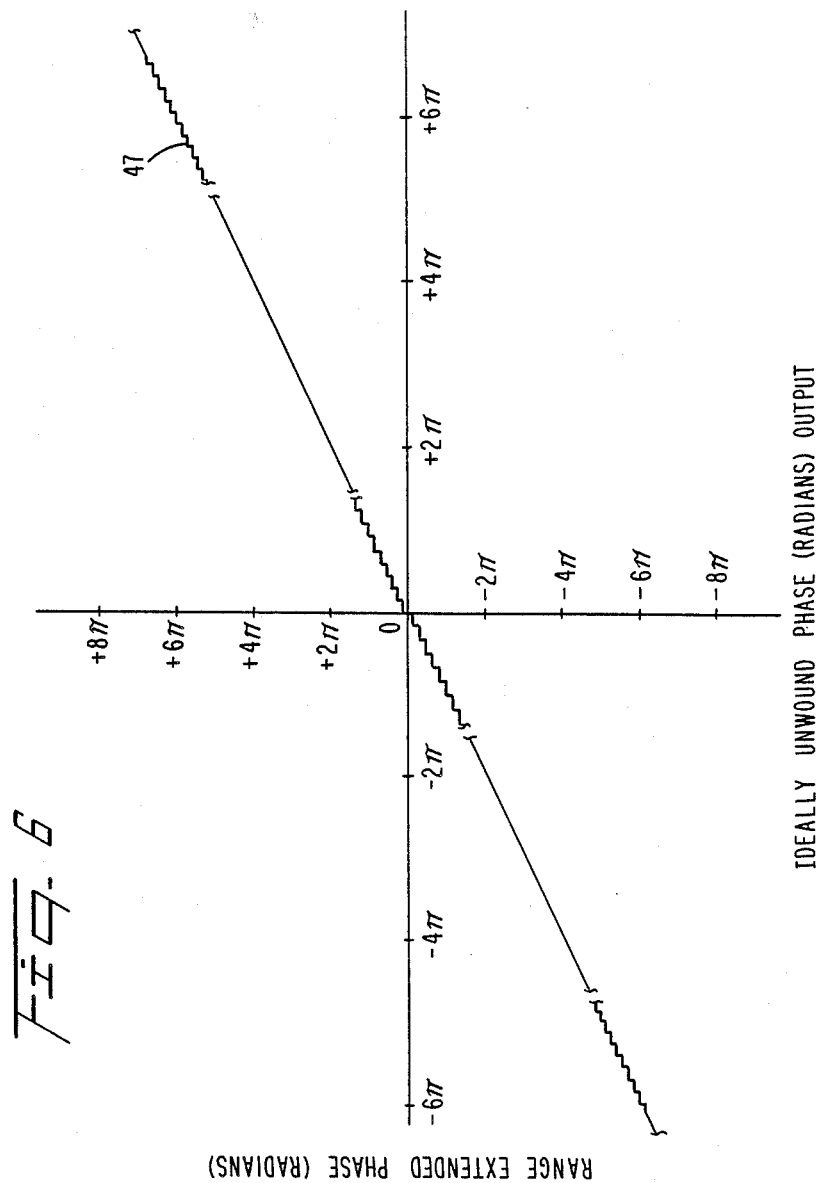
FIG. 6 is a diagram useful in describing the operation of a summing circuit illustrated in FIG. 2.

The magnitudes of the binary or digital output signals of look-up table 28 and counter 43 are linearly combined, i.e., summed together, in digital adder 46. Digital adder 46 responds to the output signals of look-up table 28 and counter 43 to derive a signal representing the phase difference between cos A(T) and cos B(T) over a several cycle difference between cos A(T) and cos B(T), as indicated by waveform 47, FIG. 6. Digital adder 46 derives a multibit signal having a polarity bit indicating the relative polarity of the cycle difference between cos A(T) and cos B(T) and several magnitude representing bits for the magnitude of the phase difference between cos A(T) and cos B(T). The five least significant bits in the output of adder 46 are the five output bits of look-up table 28 while the sixth lest significant bit and the bits having an order greater than six are derived from counter 43. Summing network 46 thus merely is an N bit output bus, where N is greater than six (usually significantly greater than six); the five least significant bits of the bus represent the bins of FIGS. 3 and 4, as specified in Tables I-III, and the higher order bits of the output bus of adder 46 are the bits on the output bus of counter 43.

The output signal of summing network 46, representing the phase difference between cos A(T) and cos B(T) over a several cycle difference between cos A(T) and cos B(T), is applied to analog converter 48 which derives a bipolarity DC signal that is applied to loop-filter 14. The magnitude of the signal applied by converter 48 to filter 14 represents the total phase difference between cos A(T) and cos B(T) over several cycles in the difference of cos A(T) and cos B(T). The polarity of the DC signal applied by converter 48 to loop filter 14 indicates whether the number of cycles of cos A(T) is greater than the number of cycles of cos B(T). As described supra, voltage controlled oscillator 13 responds to the output of filter 14 to acquire cos A(T) and track cos A(T) once cos A(T) has been acquired.

While there has been described and illustrated one specific embodiment of the invention, it will be clear that variations in the details of the embodiment specifically illustrated and described may be made without departing from the true spirit and scope of the invention as defined in the appended claims.

We claim:

1. Apparatus for deriving a signal having a magnitude indicative of the phase difference between first and second signals having similar but not necessarily the same frequencies comprising means responsive to the first and second signals for deriving third and fourth signals having amplitudes respectively representing the amplitudes of orthogonal components of the difference frequency of the first and second signals, and means responsive to the third and fourth signals for deriving fifth, sixth and seventh signals respectively indicative of (a) the cycle difference of the third and fourth signals, (b) the fractional cycle phase difference of the third and fourth signals, and (c) a combination of the amplitudes of fifth and sixth signals.

2. The apparatus of claim 1 wherein the means for deriving the sixth signal determines the fractional cycle difference from a function of the ratio of the third signal to the fourth signal.

3. The apparatus of claim 1 wherein the means for deriving the sixth signal includes a table look-up responsive to the amplitudes of the third and fourth signals for deriving the sixth signal as an approximate function of the arc tangent of the ratio of the amplitudes of the third to the fourth signals.

4. The apparatus of claim 3 wherein the means for deriving the sixth signal determines in which of several amplitude ranges the third and fourth signals fall and derives the sixth signal from stored approximations relating the determined amplitude ranges to the arc tangent of the ratio of the amplitudes of the third and fourth signals.

5. The apparatus of claim 1 wherein the means for deriving the fifth signal counts cycle slippage between the third and fourth signals.

6. The apparatus of claim 5 wherein the means for deriving the fifth signal increments and decrements the cycle slippage count in response to the amplitude of the third signal having a first predetermined polarity while the amplitude of the fourth signal changes polarity in first and second directions, respectively.

7. The apparatus of claim 1 wherein the means for deriving the fifth, sixth and seventh signals derives the fifth, sixth and seventh signals with amplitudes respectively proportional to: the cycle difference of the third and fourth signals, the fractional cycle phase difference of the third and fourth signals and the sum of the amplitudes of the fifth and sixth signals, whereby the seventh signal has an amplitude that is linearly proportional to the phase difference between the first and second signals over several cycles between them 8. The apparatus of claim 1 wherein the means for deriving the fifth, sixth and seventh signals includes (a) bi-directional counter means, (b) analog to digital converter means responsive to the third and fourth signals for deriving first and second digital signals having values representing the polarity and amplitude of the third and fourth signals, and (c) means responsive to the first and second digital signals for deriving third and fourth digital signals having values controlled by the polarity of the first and second digital signals, (d) means for incrementing and decrementing said counter means in response to the values of the third and fourth signals so that said counter means derives a fifth digital signal having a value commensurate with the cycle difference between said first and second signals, (e) means responsive to the first and second digital signals for deriving a sixth digital signal having a value representing the arc tangent of the amplitudes of the ratio of the value first digital signal to the value of the second digital signal, (f) means for summing said fifth and sixth digital signals for deriving a seventh digital signal, and (g) digital to analog converter means responsive to the seventh signal for deriving an analog signal having an amplitude representing the sum of the values of the fifth and sixth digital signals.

9. Apparatus for deriving a signal having a magnitude indicative of the phase difference between first and second signals having similar but not necessarily the same frequencies comprising mixer means responsive to the first and second signals for deriving third and fourth signals commensurate with cos $\phi$ and sin $\phi$, where
$\phi = \phi_N + \phi_x$ $\phi_N =$ the integer cycle difference between the first and second signals, and $\phi_x =$ the fractional cycle phase difference of the first and second signals, and means responsive to the third and fourth signals for deriving fifth, sixth and seventh $\phi_x$ signals having values respectively representing $\phi_N$, $\phi_x$ and the sum $\phi_N + \phi_x$.

10. The apparatus of claim 9 wherein the means for deriving the sixth signal determines $\phi_x$ from a function of the ratio of the third signal to the fourth signal.

11. The apparatus of claim 9 wherein the means for deriving the sixth signal includes a table look-up responsive to the amplitudes of the third and fourth signals for deriving the sixth signal as an approximate function of the arc tangent of the ratio of the amplitudes of the third to the fourth signals.

12. The apparatus of claim 11 wherein the means for deriving the sixth signal determines in which of several amplitude ranges the third and fourth signals fall and derives the sixth signal from stored approximations relating the determined amplitude ranges to the arc tangent of the ratio of the amplitudes of the third and fourth signals.

13. The apparatus of claim 9 wherein the means for deriving the fifth signal counts cycle slippage between the third and fourth signals 14. The apparatus of claim 13 wherein the means for deriving the fifth signal increments and decrements the cycle slippage count in response to the amplitude of the third signal having a first predetermined polarity while the amplitude of the fourth signal changes polarity in first and second directions, respectively.

15. The apparatus of claim 9 wherein the means for deriving the fifth, sixth and seventh signals derives the fifth, sixth and seventh signals with amplitudes respectively proportional to: the integer cycle difference between the third and fourth signals, the fractional cycle phase difference of the third and fourth signals and the sum of the amplitudes of the fifth and sixth signals, whereby the seventh signal has an amplitude that is linearly proportional to the phase difference between the first and second signals over several cycles of the cycle difference between them.

16. The apparatus of claim 9 wherein the means for deriving the fifth, sixth and seventh signals includes (a) bi-directional counter means (b) analog to digital converter means responsive to the third and fourth signals for deriving first and second digital signals having values representing the polarity and amplitude of the third and fourth signals and (c) means responsive to the first and second digital signals for deriving third and fourth digital signals having values controlled by the polarity of the first and second digital signals, (d) means for incrementing and decrementing said counter means in response to the values of the third and fourth signals so that said counter means derives a fifth digital signal having a value commensurate with the integer cycle difference between said first and second signals, (e) means responsive to the first and second digital signals for deriving a sixth digital signal having a value representing the arc tangent of the amplitudes of the ratio of the value first digital signal to the value of the second digital signal, (f) means for summing said fifth and sixth digital signals for deriving a seventh digital signal, and (g) digital to analog converter means responsive to the seventh signal for deriving an analog signal having an amplitude representing the sum of the values of the fifth and sixth digital signals.

17. A phase lock loop responsive to an input signal comprising a variable frequency oscillator having a frequency control input terminal and a variable frequency output signal, means responsive to the input and output signals for deriving a control signal having an amplitude commensurate with the integer cycle and fractional cycle phase displacement between the input and output signals even though the frequencies of the input and output signals differ from each other by more than one cycle, the control signal being applied to the oscillator input terminal to cause the oscillator to respond to the amplitude of the control signal to change the frequency and phase of the oscillator so the oscillator output signal tracks integer cycle and fractional cycle changes of the input signal relative to the output signal.

18. The apparatus of claim 17 wherein the amplitude is linearly proportional to the sum of the integer cycle and fractional cycle phase differences between the input and output signals.

19. The apparatus of claim 17 wherein the control signal deriving means includes means responsive to the input and the output signals for deriving first and second signals proportional to sin $\phi$ and cos $\phi$ where $\phi = \phi_N + \phi_x$ $\phi_N =$ integer cycle difference between the first and second signals, and $\phi_x =$ the fractional cycle phase difference of the first and second signals, means responsive to the first and second signals for deriving third and fourth signals having amplitudes respectively representing $\phi_x$ and $\phi_N$ and for deriving a fifth signal having an amplitude representing the sum of the amplitudes represented by the third and fourth signals.

20. The apparatus of claim 19 wherein the means for deriving the third, fourth and fifth signals includes look-up table means for deriving the third signal in response to the amplitudes of the first and second signals.

21. The apparatus of claim 20 wherein the means for deriving the third, fourth and fifth signals includes counter means and logic means for incrementing and decrementing the counter means in response to one of the first and second signals having a first predetermined value while the other of the first and second signals has first and second polarity transitions respectively, the state of the counter means having a value representing the amplitude of the fourth signal.

22. The apparatus of claim 1 wherein the means for deriving the third, fourth and fifth signals includes: counter means, and logic means for incrementing and decrementing the counter means in response to one of the first and second signals having a first predetermined value while the other of the first and second signals has first and second polarity transitions respectively, the state of the counter means having a value representing the magnitude of the fourth signal.

23. The apparatus of claim 17 wherein the control signal deriving means includes means responsive to the input and output signals for deriving third and fourth signals having amplitudes respectively representing the amplitudes of orthogonal components of the cycle difference between the input and output signals, and means responsive to the third and fourth signals for deriving fifth, sixth and seventh signals respectively indicative of (a) the cycle difference between the third and fourth signals, (b) the fractional cycle phase difference between the third and fourth signals, and (c) a combination of the amplitudes of fifth and sixth signals.

24. The apparatus of claim 23 wherein the means for deriving the sixth signal determines the fractional cycle phase difference from a function of the ratio of the third signal to the fourth signal.

25. The apparatus of claim 23 wherein the means for deriving the sixth signal includes a table look-up responsive to the amplitudes of the third and fourth signals for deriving the sixth signal as an approximate function of the arc tangent of the ratio of the amplitudes of the third to the fourth signals.

26. The apparatus of claim 25 wherein the means for deriving the sixth signal determines in which of several amplitude ranges the third and fourth signals fall and derives the sixth signal from stored approximations relating the determined amplitude ranges to the arc tangent of the ratio of the amplitudes of the third and fourth signals.

27. The apparatus of claim 23 wherein the means for deriving the fifth signal counts cycle slippage between the third and fourth signals.

28. The apparatus of claim 27 wherein the means for deriving the fifth signal increments and decrements the cycle slippage count in response to the amplitude of the third signal having a first predetermined polarity while the amplitude of the fourth signal changes polarity in first and second directions, respectively.

29. The apparatus of claim 23 wherein the means for deriving the fifth, sixth and seventh signals derives the fifth, sixth and seventh signals with amplitudes respectively proportional to: the cycle difference of the third and fourth signals, the fractional cycle phase difference of the third and fourth signals and the sum of the amplitudes of the fifth and sixth signals, whereby the seventh signal has an amplitude that is linearly proportional to the phase difference between the first and second signals over several cycles of the difference between them.

30. The apparatus of claim 23 wherein the means for deriving the fifth, sixth and seventh signals includes (a) bi-directional counter means (b) analog to digital converter means responsive to the third and fourth signals for deriving first and second digital signals having values representing the polarity and amplitude of the third and fourth signals and (c) means responsive to the first and second digital signals for deriving third and fourth digital signals having values controlled by the polarity of the first and second digital signals, (d) means for incrementing and decrementing said counter means in response to the values of the third and fourth signals so that said counter means derives a fifth digital signal having a value commensurate with the cycle difference between said first and second signals, (e) means responsive to the first and second digital signals for deriving a sixth digital signal having a value representing the arc tangent of the amplitudes of the ratio of the value first digital signal to the value of the second digital signal, (f) means for summing said fifth and sixth digital signals for deriving a seventh digital signal, and (g) digital to analog converter means responsive to the seventh signal for deriving an analog signal having an amplitude representing the sum of the values of the fifth and sixth digital signals.

31. Apparatus for deriving a signal having magnitude indicative of the fractional phase difference between first and second signals having similar but not necessarily the same frequencies comprising mixer means responsive to the first and second signals for deriving third and fourth analog signals commensurate with cos $\phi$ and sin $\phi$, where $$\phi = \phi_N + \phi_x$$

$\phi_N$ = the integer cycle difference between the first and second signals, and $\phi_x$ = the fractional cycle phase difference of the first and second signals, and means responsive to the third and fourth signals for deriving first and second multibit digital signals representing the values of cos $\phi$ and sin $\phi$, argument $2\pi$, over a four quadrant range, table look-up means responsive to the first and second digital signals for deriving a third digital signal having P bits representing a discrete fractional value of $\phi$ relative to a one cycle difference between the first and second signals, where P is an integer greater than one and $2^P$ is approximately the number of discrete fractional values of $\phi$ but is no greater than the number of discrete fractional values of $\phi$, the fractional value of the bits increasing progressively from a minimum value of the P bits for a first fractional value of $\phi$ to a maximum value of the P bits for a second fractional value of $\phi$, the first and second fractional values being adjacent angles around the periphery of a circle defined by the phase angle between the first and second signals with no noise on the first and second signals, the values accurately representing the fractional values between the minimum and maximum values of the P bits.

* * * * *